(12) United States Patent
Kamo et al.

(10) Patent No.: US 8,319,225 B2
(45) Date of Patent: Nov. 27, 2012

(54) DISPLAY DEVICE AND MANUFACTURING METHOD THEREOF

(75) Inventors: Takahiro Kamo, Shibuya (JP); Takeshi Noda, Mobara (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 544 days.

(21) Appl. No.: 12/611,951

(22) Filed: Nov. 4, 2009

(65) Prior Publication Data

US 2010/0109014 A1    May 6, 2010

(30) Foreign Application Priority Data

Nov. 5, 2008  (JP) ................................ 2008-284037

(51) Int. Cl.
*H01L 33/00*    (2010.01)
(52) U.S. Cl. ........... 257/72; 257/E33.003; 257/E29.294; 257/E21.418; 438/158
(58) Field of Classification Search .................... 257/72, 257/E29.294, E33.003
See application file for complete search history.

(56) References Cited

U.S. PATENT DOCUMENTS 3,764,396 A * 10/1973 Turui et al. .................... 438/377
2009/0090916 A1 * 4/2009 Yamazaki et al. .............. 257/66

* cited by examiner

*Primary Examiner* — Zandra Smith
*Assistant Examiner* — Paul Patton
(74) *Attorney, Agent, or Firm* — Antonelli, Terry, Stout & Kraus, LLP

(57) ABSTRACT

A display device includes: a conductive layer on which gate electrodes are formed; a first insulation layer which is formed on the conductive layer; a semiconductor layer which is formed on the first insulation layer and is provided for forming semiconductor films which contain poly-crystalline silicon above the gate electrodes; and a second insulation layer which is formed on the semiconductor layer. Here, the semiconductor film includes a channel region which overlaps with the gate electrode as viewed in a plan view. In the channel region, a portion of the semiconductor film which is in contact with the second insulation layer exhibits higher impurity concentration than a portion of the semiconductor film which is in contact with the first insulation layer.

8 Claims, 12 Drawing Sheets

DISPLAY DEVICE AND MANUFACTURING METHOD THEREOF

The present application claims priority from Japanese application JP 2008-284037 filed on Nov. 5, 2008, the content of which is hereby incorporated by reference into this application.

BACKGROUND OF THE INVENTION

1. Field of the Invention

The present invention relates to a display device and a manufacturing method thereof.

2. Description of the Related Art

In a display device such as a liquid crystal display device, the development of a display device which uses bottom-gate-type thin film transistors formed by using poly-crystalline silicon has been in progress. In case of the bottom-gate-type thin film transistor, a gate electrode is formed on an insulation substrate, and a first insulation film, a semiconductor film and a second insulation film are formed on the gate electrode in that order. The semiconductor film has a channel region, and the channel region overlaps with the gate electrode as viewed in a plan view. An impurity region doped with impurities which impart an n-type, for example, to the region is formed at a portion of the semiconductor film around the channel region. The channel region is doped with impurities which impart a type (p type, for example) different from the type imparted to the impurity region for controlling characteristics of the thin film transistor such as a threshold voltage. Doping of impurities into the channel region of the semiconductor film is performed using an ion implantation method or the like, for example. In this case, the channel region is doped with impurities such that the maximum level of concentration of the impurities in the film thickness direction of the semiconductor film is arranged at or below a center portion of the semiconductor film. To study the distribution of impurity concentration in the channel region, the impurity concentration of a portion of the channel region in the vicinity of a surface thereof which is in contact with the second insulation film does not exceed impurity concentration of a portion of the channel region in the vicinity of the surface thereof which is in contact with the first insulation film.

SUMMARY OF THE INVENTION

In the manufacture of a display device using poly-crystalline silicon, after forming a semiconductor film, an insulation film (second insulation film) and a line material are formed and processed over the semiconductor film. At the time of forming or processing the second insulation film and the line material, a charge stays in the second insulation film which is arranged above a region of the semiconductor film which corresponds to a channel region of a thin film transistor, and such a charge remains as a fixed charge after the display device is manufactured.

The fixed charge of the insulation film influences characteristics of a thin film transistor. In case of an n-type thin film transistor, carriers are liable to be induced in the channel region in the vicinity of an insulation film in which the fixed charge remains, and an electric current is liable to flow through such a portion. Particularly, in the channel region of the bottom-gate-type thin film transistor, when a switch is turned on, an electric current flows not only in a portion of the channel region in the vicinity of a lower surface of the channel region (front channel) where a normal electric current flows but also in a portion of the channel region in the vicinity of an upper surface of the channel region opposite to the lower surface (back channel). Accordingly, a hump appears in a Vg-Id characteristic of the thin film transistor thus making a control of the characteristics of the thin film transistor at the time of manufacture difficult.

The present invention has been made to overcome the above-mentioned drawbacks, and it is an object of the present invention to provide a display device which improves characteristics of a bottom-gate-type thin film transistor.

To briefly explain the summary of typical inventions among the inventions disclosed in this specification, they are as follows.

According to one aspect of the present invention, there is provided a display device which includes: a conductive layer on which gate electrodes are formed; a first insulation layer which is formed on the conductive layer; a semiconductor layer which is formed on the first insulation layer and is provided for forming semiconductor films which contain poly-crystalline silicon above the gate electrodes; and a second insulation layer which is formed on the semiconductor layer, wherein the semiconductor film includes a channel region which overlaps with the gate electrode as viewed in a plan view, and in the channel region, a portion of the semiconductor film which is in contact with the second insulation layer exhibits higher impurity concentration than a portion of the semiconductor film which is in contact with the first insulation layer.

In one mode of the present invention, the semiconductor film in the channel region may have a peak where the impurity concentration becomes maximum at an upper side from the center of the semiconductor film in the film thickness direction.

In another mode of the present invention, the semiconductor film in the channel region may have the distribution of impurity concentration where the impurity concentration is monotonously decreased toward an upper surface of the semiconductor film from a position where the semiconductor film exhibits the peak in impurity concentration, and the impurity concentration is monotonously decreased toward a lower surface of the semiconductor film from the peak in impurity concentration.

In still another mode of the present invention, the impurities may be made of boron.

In a further mode of the present invention, the semiconductor film may be doped with ions of the impurities which are accelerated by an electric field such that the peak in the distribution of the impurities is positioned at an upper side from the center of the semiconductor film in the channel region.

According to another aspect of the present invention, there is provided a manufacturing method of a display device which includes the steps of: forming a conductive layer in which gate electrodes are formed on an insulation substrate; forming a first insulation layer on the conductive layer; forming a semiconductor layer which contains poly-crystalline silicon and in which semiconductor films which overlap with the gate electrodes as viewed in a plan view are formed on the first insulation layer; forming a second insulation layer on the semiconductor layer; and doping the semiconductor films with the impurities such that the concentration of impurities in a portion of the semiconductor film which is in contact with the second insulation layer is set higher than the concentration of impurities in a portion of the semiconductor film which is in contact with the first insulation layer.

In one mode of the present invention, the step of doping the semiconductor films with the impurities may be a step where ions of the impurities which are accelerated by an electric field are implanted into the semiconductor film such that a peak of the distribution of the impurity concentration in the film thickness direction is positioned at an upper side from the center of the semiconductor film.

In another mode of the present invention, the impurities may be made of boron.

The present invention provides the display device which can suppress the occurrence of a hump which appears in a Vg-Id characteristic of the thin film transistor thus improving characteristics of the thin film transistor.

DESCRIPTION OF THE PREFERRED EMBODIMENTS

Hereinafter, an embodiment of the present invention is explained in detail in conjunction with drawings. A display device according to the present invention is an IPS (In-Plane-Switching)-type liquid crystal display device. The liquid crystal display device is constituted of an array substrate, a filter substrate which is arranged to face the array substrate in an opposed manner and forms color filters thereon, a liquid crystal material which is sealed in a region sandwiched between both substrates, and drivers IC which are mounted on the array substrate. Both the array substrate and the filter substrate are formed of a glass substrate or the like.

Figure 1:
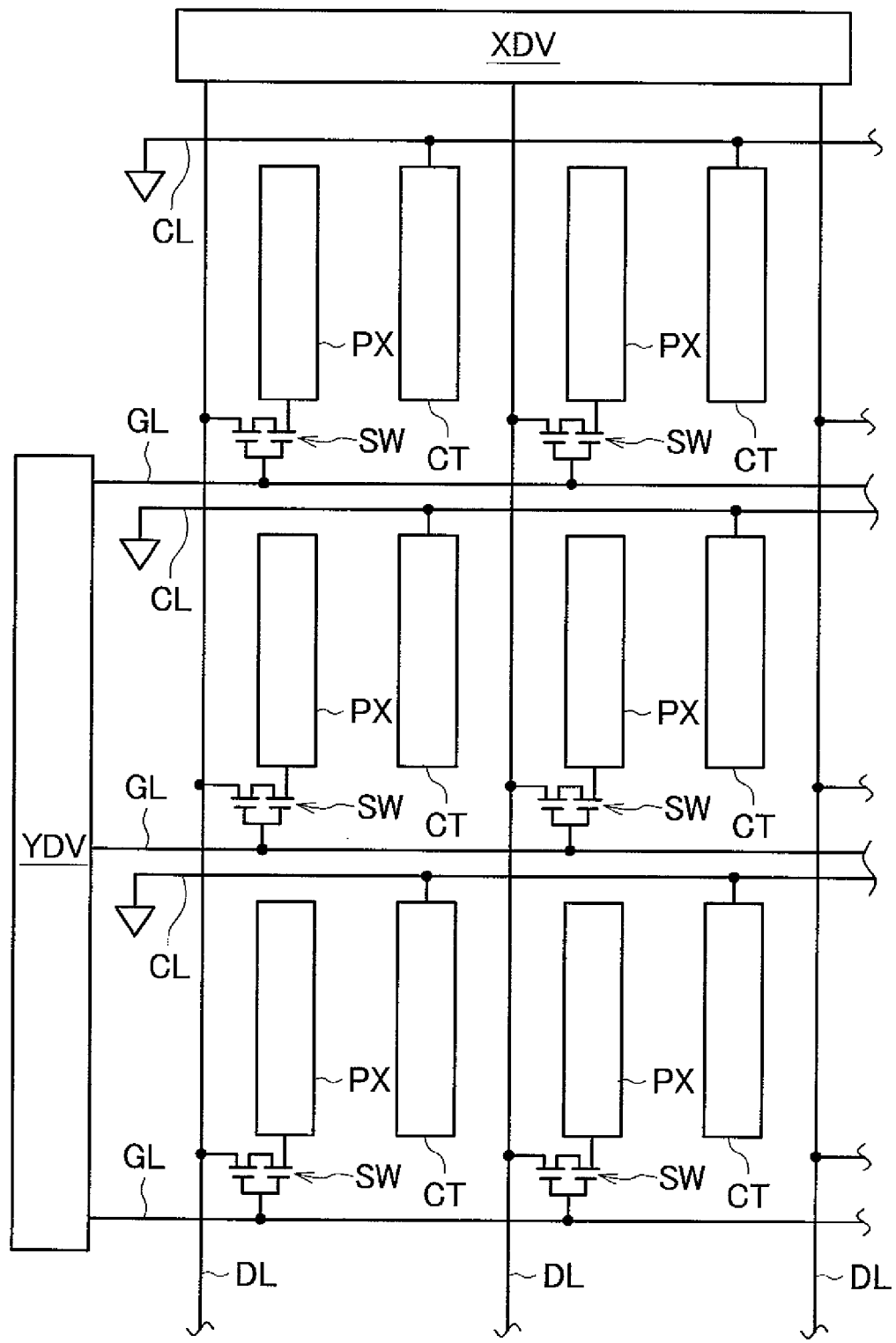
FIG. 1 is a view showing an equivalent circuit of a display region and a region around the display region on an array substrate according to an embodiment of the present invention.

FIG. 1 is a view showing an equivalent circuit of a display region and a region around the display region on the array substrate according to the embodiment of the present invention. In the display region on the array substrate, a large number of gate signal lines GL extend in the lateral direction in a state where the gate signal lines GL are arranged parallel to each other in the longitudinal direction and are connected to a gate signal line drive circuit YDV. A large number of video signal lines DL extend in the longitudinal direction in a state where the video signal lines are also arranged parallel to each other in the lateral direction and are connected to a video signal line drive circuit XDV. Further, the display region is defined in a matrix array by the gate signal lines GL and the video signal lines DL so as to form a plurality of defined regions, and each defined region constitutes one pixel region. Common signal lines CL extend in the lateral direction in a state where each common signal line CL corresponds to each gate signal line GL.

A pixel switch SW is arranged in each pixel region corresponding to a position where the gate signal line GL and the video signal line DL intersect each other. The pixel switch SW is a thin film transistor having a so-called multi-gate structure. Here, gate electrodes of two transistors are connected to each other so as to form a gate electrode of the pixel switch SW, a source electrode of one transistor and a drain electrode of the other transistor are connected to each other, and an unconnected source electrode and an unconnected drain electrode constitute a source electrode and a drain electrode of the pixel switch SW respectively. The gate electrode of the pixel switch SW is connected to the gate signal line GL, and the drain electrode of the pixel switch SW is connected to the video signal line DL. Further, the pixel electrode PX and the common electrode CT are formed in each pixel region as a pair, the pixel electrode PX is connected to the source electrode of the pixel switch SW, and the common electrode CT is connected to the common signal line CL. Here, there is usually no polarity between the source electrode and the drain electrode of the pixel switch SW and hence, the connection destination of the pixel electrode PX and the connection destination of the common electrode CT may be reversed.

In the above-mentioned circuit constitution, a reference voltage is applied to the common electrode CT of each pixel via the common signal line CL and a gate voltage is applied to the gate signal line GL so that a pixel row is selected. Further, by supplying a vide signal to each video signal line DL at the timing of selecting the pixel row, a voltage of the video signal is applied to the pixel electrode PX of each pixel of the pixel row. Due to such application of the voltage, a lateral electric field having a force corresponding to a voltage of the video signal is generated between the pixel electrode PX and the common electrode CT, and the alignment direction of liquid crystal molecules is determined corresponding to the intensity of the lateral electric field.

Figure 2:
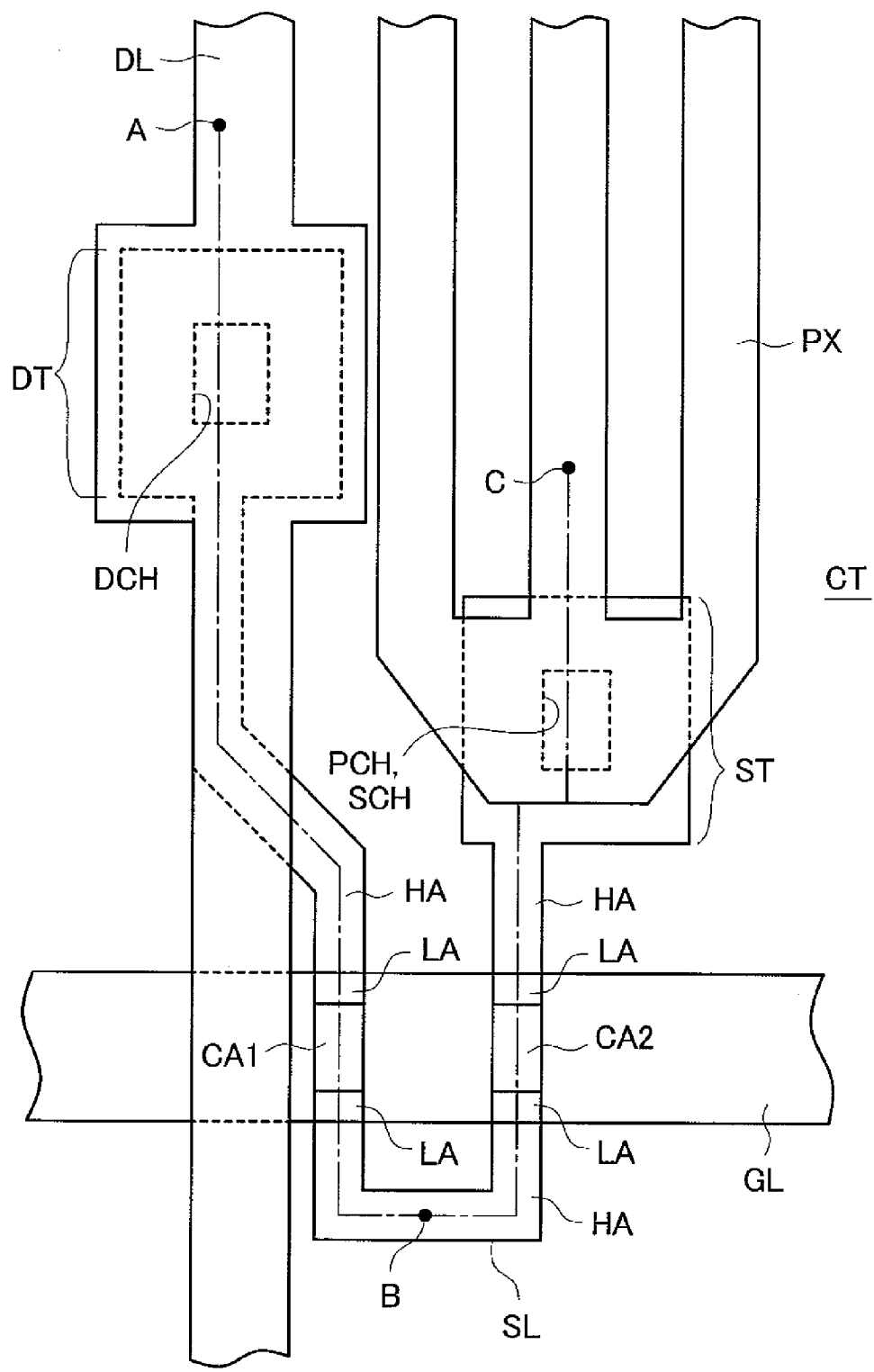
FIG. 2 is an enlarged plan view of one pixel region of the array substrate according to the embodiment of the present invention.

FIG. 2 is an enlarged plan view of one pixel region on the array substrate. In FIG. 2, for facilitating the explanation, layers which possess conductivity are mainly shown, and insulation layers each of which is formed between the respective conductive layers are not shown. In the drawing, the gate signal line GL extends in the lateral direction, and the video signal line DL extends in the longitudinal direction. The semiconductor film SL constitutes a portion of the pixel switch SW shown in FIG. 1. One end of the semiconductor film SL is connected to the video signal line DL via the drain electrode DT on an upper side of the drawing. The drain electrode DT connects the semiconductor film SL and the video signal line DL via a contact hole DCH. The other end of the semiconductor film SL is connected to the source electrode ST via a contact hole SCH at an area slightly below the center of the pixel region, and the source electrode ST of the semiconductor film SL is connected to the pixel electrode PX via a contact hole PCH. The pixel electrode PX has a comb-teeth shape and is positioned at the substantially center of the pixel region. The common electrode CT which is arranged below the pixel electrode PX is disposed in a region sandwiched between a plurality of neighboring gate signal lines GL as viewed in a plan view, and is arranged spaced-apart from the contact hole PCH as viewed in a plan view. Here, the common electrodes CT per se are connected to each other in the lateral direction thus also functioning as the common signal line CL. As a matter of course, the common signal line CL may be provided independently from the common electrodes CT. Further, an alignment film is not shown in the drawing.

Hereinafter, the structure of the semiconductor film SL is explained. The semiconductor film SL has a strip shape and has the same strip width along the whole length thereof. The strip-shaped semiconductor film SL extends below and parallel to the video signal line DL from a connection portion thereof with the drain electrode DT arranged at an A-side end in the drawing and, next, is bent in the oblique direction thus being away from an area below the video signal line DL, and extends parallel to the video signal line DL again. Thereafter, the semiconductor film SL orthogonally intersects with the strip-shaped gate signal line GL which is positioned below the semiconductor film SL with the gate insulation film GI interposed therebetween. Thereafter, the semiconductor film SL goes back and orthogonally intersects with the gate signal line GL again. Further, the strip-shaped semiconductor film SL extends parallel to the video signal line DL and is connected to the source electrode ST arranged at a C-side end in the drawing. The semiconductor film SL is constituted of a first impurity region HA, a second impurity region LA, and channel regions CA1, CA2 which are defined from each other depending on an impurities doping state of each region. With respect to two regions where the semiconductor film SL overlaps with the gate signal line GL as view in a plan view, the region arranged close to the A side in the drawing is constituted of the channel region CA1 and second impurity regions LA which are arranged adjacent to both ends of the channel region CA1. On the other hand, the region arranged close to the C side in the drawing is constituted of the channel region CA2 and second impurity regions LA which are arranged adjacent to both ends of the channel region CA2. A region of the semiconductor film SL which does not overlap with the gate signal line GL as viewed in a plan view constitutes the first impurity region HA. In the first impurity region HA and the second impurity regions LA, impurities (for example, phosphorous or the like) which impart n-type conductivity are diffused. The impurity concentration in the first impurity region HA is set higher than the impurity concentration of the second impurity region LA.

Figure 3:
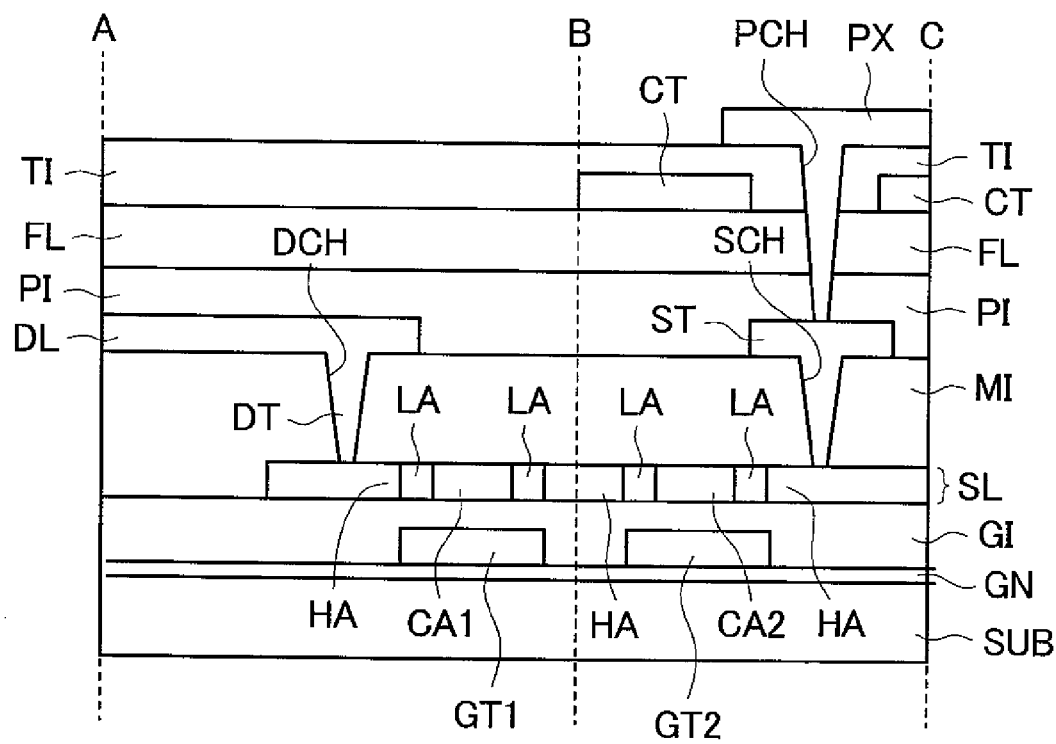
FIG. 3 is a cross-sectional view taken along a line A-B-C in FIG. 2.

FIG. 3 is a cross-sectional view taken along a line A-B-C in FIG. 2. A contamination prevention film GN is formed on the array substrate SUB, and the gate signal line GL is formed on the contamination prevention film GN. In FIG. 2, a portion of the gate signal line GL which intersects with the semiconductor film SL between points "A" and "B" is indicated as a gate electrode GT1, and a portion of the gate signal line GL which intersects with the semiconductor film SL between points "B" and "C" is indicated as a gate electrode GT2 respectively. These gate electrodes GT1, GT2 are portions of the gate signal line GL, and function also as the gate electrode of the thin film transistor. The gate insulation film GI is formed on a layer for forming the gate signal line GL. The semiconductor film SL is formed on a layer for forming the gate insulation film GI. As described above, the semiconductor film SL is constituted of the first impurity region HA, the second impurity region LA, and the channel regions CA1, CA2 which are defined from each other.

On the layer for forming the semiconductor film SL, an interlayer insulation film MI made of silicon nitride, for example, is formed. A contact hole SCH and a contact hole DCH are formed in an interlayer insulation film MI in a penetrating manner. The contact hole DCH reaches an upper surface of the first impurity region HA on a "A" point side of the semiconductor film SL, and the inside of the contact hole DCH is filled with an electrode material thus forming the drain electrode DT. The drain electrode DT is connected to the video signal line DL which is formed on the interlayer insulation film MI. The contact hole SCH reaches an upper surface of the first impurity region HA on a "C" point side of the semiconductor film SL, and the inside of the contact hole SCH is filled with an electrode material thus forming a portion of the source electrode ST. The source electrode ST is also formed on the interlayer insulation film MI as a film which is spaced apart from the video signal line DL. Insulation layers consisting of a lower insulation protective film PI and a leveling film FL are formed on the respective electrodes in this order. The common electrode CT which is formed of a transparent electrode film is formed on the leveling film FL, and an upper insulation protective film TI is formed on the common electrode CT. In the upper insulation protective film TI, the leveling film FL, the lower insulation protective film PI, a contact hole PCH which penetrates the respective films and reaches the source electrode ST is formed. On an inner side of the contact hole PCH and on the periphery of the contact hole PCH, the pixel electrode PX which is formed of a transparent electrode is formed. Here, the contact hole PCH and the common electrode CT are spaced apart from each other.

Figure 4:
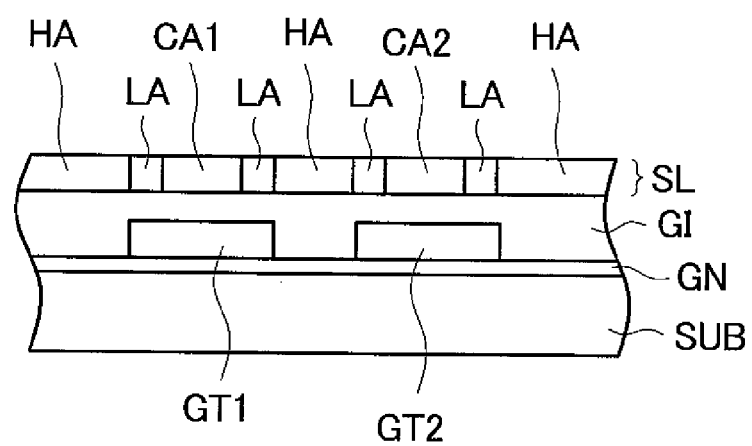
FIG. 4 is a partially enlarged view of a cross section of a thin film transistor according to the embodiment of the present invention.

FIG. 4 is a partially enlarged view of a cross section of the thin film transistor according to the embodiment of the present invention. In the drawing, out of the constitution shown in FIG. 3, the constitution ranging from the array substrate SUB to the semiconductor film SL, the gate electrodes GT1, GT2, and portions around the gate electrodes GT1, GT2 are shown. The semiconductor film SL includes a channel region CA1 which overlaps with the gate electrode GT1 and a channel region CA2 which overlaps with the gate electrode GT2 as viewed in a plan view. In the drawing, a left side of the channel region CA1 is electrically connected to the drain electrode DT not shown in the drawing via the second impurity region LA and the first impurity region HA. A right side of the channel region CA2 is electrically connected to the source electrode ST not shown in the drawing via the second impurity region LA and the first impurity region HA. Between the channel region CA1 and the channel region CA2, the regions consisting of the second impurity region LA, the first impurity region HA and the second impurity region LA are continuously arranged in this order. The second impurity regions LA which are positioned on both sides of the channel region CA1 overlap with the gate electrode GT1 as viewed in a plan view, and the second impurity regions LA which are positioned on both sides of the channel region CA2 overlap with the gate electrode GT2 as viewed in a plan view. Here, the structure in which the second impurity regions LA, the channel region and the gate electrode satisfy the above-mentioned relationship is referred to as the GOLD (Gate Overlapped Lightly Doped Drain) structure.

Figure 5:
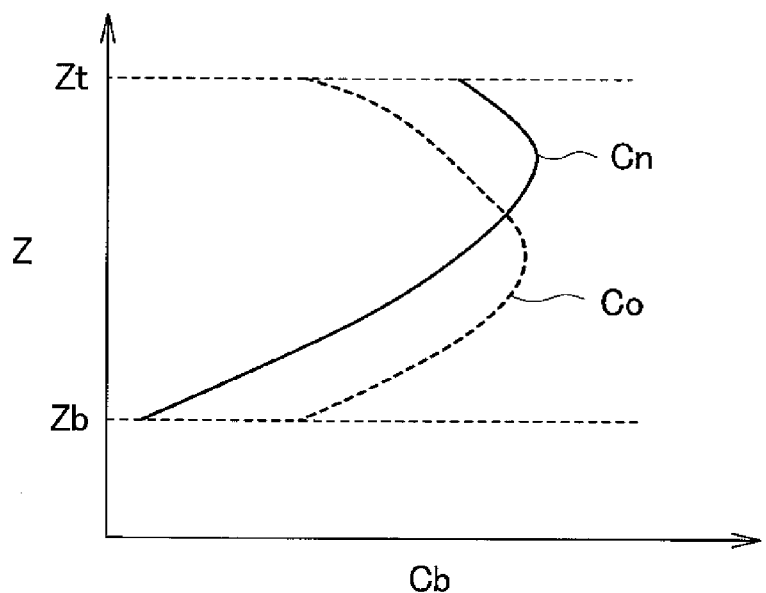
FIG. 5 is a graph showing the distribution of the impurity concentration in the thickness direction in a channel region of the thin film transistor according to the embodiment of the present invention and of a conventional thin film transistor.

FIG. 5 is a graph showing the distribution of impurity concentration in the film thickness direction in the channel regions CA1, CA2 of the thin film transistor according to the embodiment of the present invention and of a conventional thin film transistor. In the drawing, a position Z in the channel regions CA1, CA2 in the film thickness direction (hereinafter, referred to as a height) is taken on an axis of ordinates, wherein symbol Zt indicates a height of an upper surface of the channel region, and symbol Zb indicates a height of a lower surface of the channel region. The concentration Cb of impurities is taken on an axis of abscissas. FIG. 5 is a semi-logarithmic graph in which an axis of abscissas takes a logarithm scale. In the drawing, the impurity concentration distribution Co in the conventional thin film transistor is indicated by a broken-line curve, and an impurity concentration distribution Cn in the thin film transistor of this embodiment is indicated by a solid-line curve. The impurity concentration distribution Co in the conventional thin film transistor has a peak where the impurity concentration becomes maximum at the center in height between the upper surface and the lower surface of the channel region. The impurity concentration is monotonously decreased toward an upper side from the peak and, at the same time, is monotonously decreased also toward a lower side from the peak. The graph is a substantially quadratic curve. This implies that the impurity concentration distribution can be regarded as the normal distribution. Here, although the impurity concentration distribution does not agree with the normal distribution strictly, it is possible to determine whether or not the impurity concentration distribution can be regarded as the normal distribution by performing a statistical test of the impurity concentration. On the other hand, in the thin film transistor according to the embodiment of the present invention, the peak of the concentration is arranged at a height of the thickness of the semiconductor film obtained by internally dividing the thickness from the upper surface to the lower surface of the semiconductor film by a ratio of 1:3. Further, the impurity concentration is monotonously decreased toward an upper side from the peak and is monotonously decreased also toward a lower side from the peak.

Figure 6:
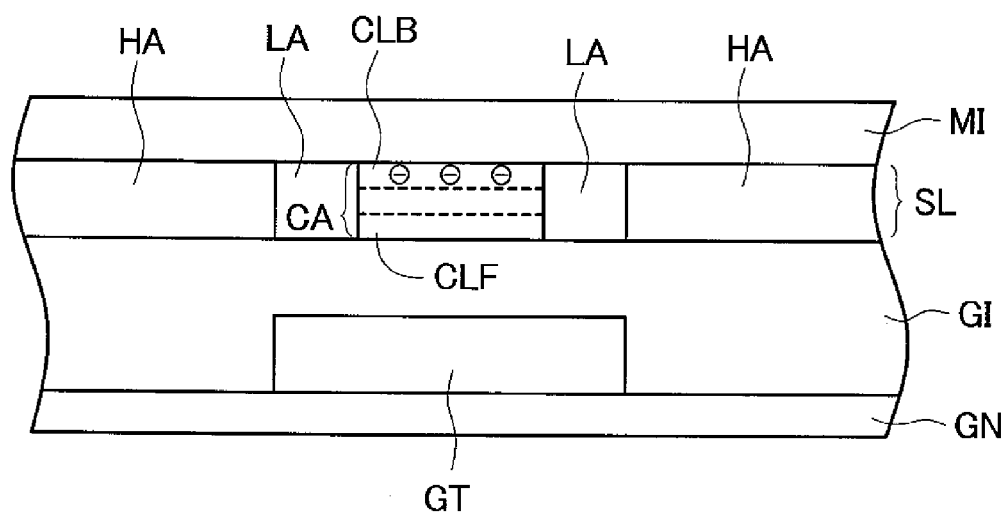
FIG. 6 is a view for explaining a concept of a back channel.

FIG. 6 is a view showing the concept of the back channel. For facilitating the explanation, in the drawing, a single-gate type thin film transistor is shown. The semiconductor layer SL is constituted of the channel region CA, the second impurity regions LA arranged on both sides of the channel region CA respectively, and the first impurity regions HA are further arranged on both sides of the second impurity regions LA respectively. The channel region CA and the second impurity regions LA overlap with the gate electrode GT as viewed in a plan view. A portion of the channel region CA in the vicinity of the surface which is in contact with the gate insulation film GI is a portion where carriers are induced when a voltage is applied to the gate electrode GT. This portion is referred to as a front channel portion CLF hereinafter. As also shown in the drawing, the back channel portion CLB and the front channel portion CLF do not overlap with each other and are spaced apart from each other. A portion of the channel region CA in the vicinity of the surface which is in contact with the inter-layer insulation film MI is a portion where carriers are induced by a fixed charge in the interlayer insulation film MI which is charged at the time of manufacture. This portion is referred to as a back channel portion CLB hereinafter. In the conventional thin film transistor, carriers are induced in the back channel portion CLB even when a voltage is not applied to the gate electrode GT and hence, an electric current which flows in the back channel portion CLB of the thin film transistor (hereinafter referred to as back channel component IBK) and an electric current which flows in the front channel portion CLF of the thin film transistor (hereinafter, referred to as a front channel component IFR) differ from each other in the Vg-Id characteristic.

Figure 7A:
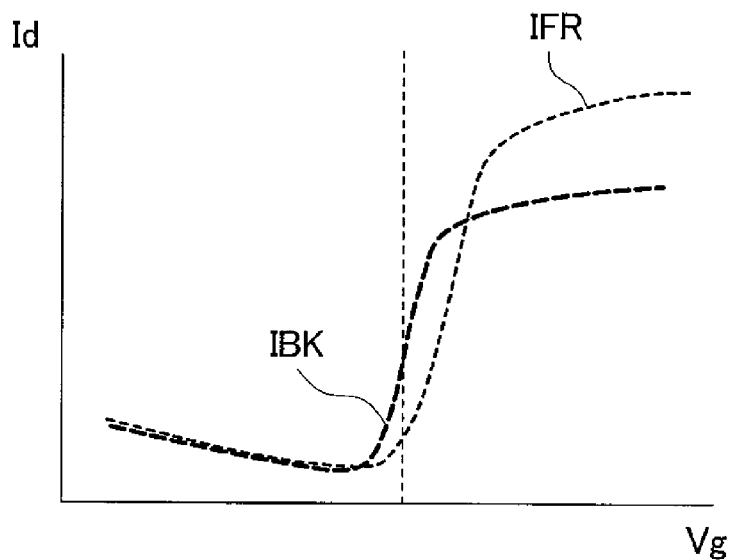
FIG. 7A is a graph showing a Vg-Id characteristic of the conventional thin film transistor where the Vg-Id characteristic is divided into a back channel component and a front channel component.
Figure 7B:
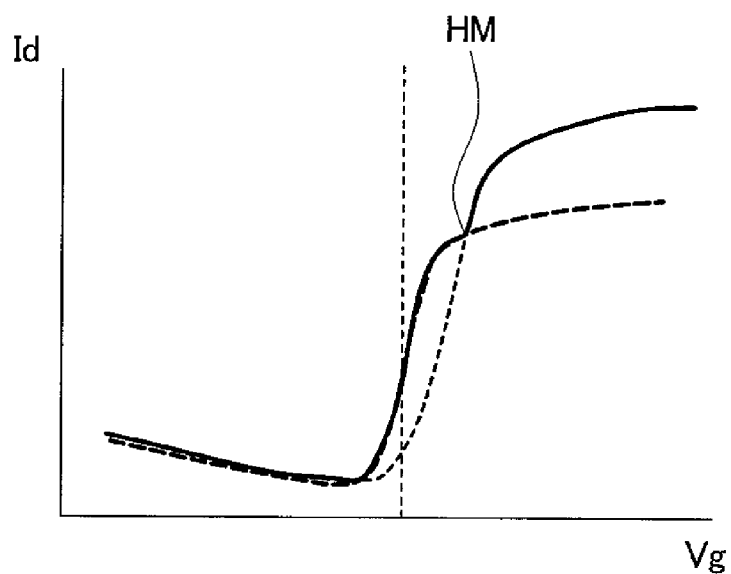
FIG. 7B is a graph showing the Vg-Id characteristic of the conventional thin film transistor.

FIG. 7A to FIG. 7D are graphs showing the Vg-Id characteristic of the thin film transistor. FIG. 7A shows the Vg-Id characteristic of the conventional thin film transistor where the Vg-Id characteristic is divided into a back channel component IBK and a front channel component IFR, FIG. 7B shows the Vg-Id characteristic of the conventional thin film transistor as a whole. FIG. 7A to FIG. 7D are semi-logarithmic graphs where a value of Id is expressed by a logarithm scale. As shown in FIG. 7A, in the conventional thin film transistor, a drain current Id of the back channel component IBK rises at a gate voltage Vg smaller than a drain current Id of the front channel component IFR. FIG. 7B shows a product obtained by synthesizing these channel components. In FIG. 7B, a solid line indicates the Vg-Id characteristic obtained by synthesizing the respective components. It is understood that a hump HM occurs in a range from a gate voltage Vg where the back channel component IBK rises to a gate voltage Vg where the front channel component IFR rises.

Figure 7C:
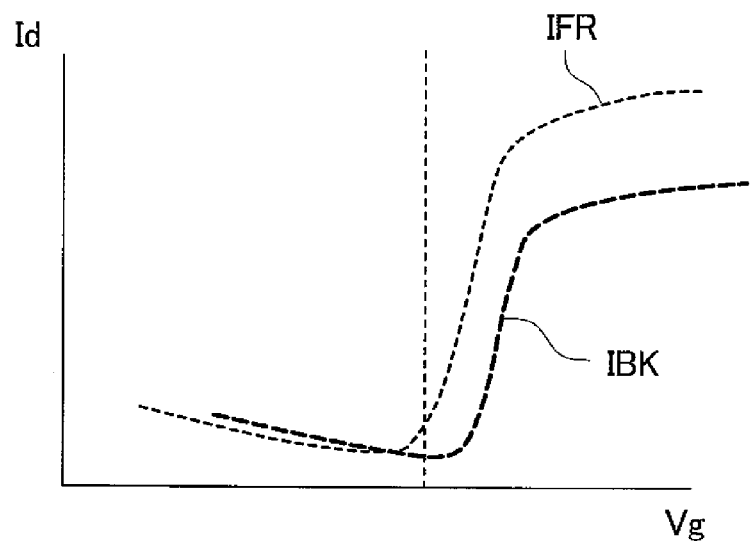
FIG. 7C is a graph showing a Vg-Id characteristic of the thin film transistor according to the embodiment of the present invention where the Vg-Id characteristic is divided into a back channel component and a front channel component.
Figure 7D:
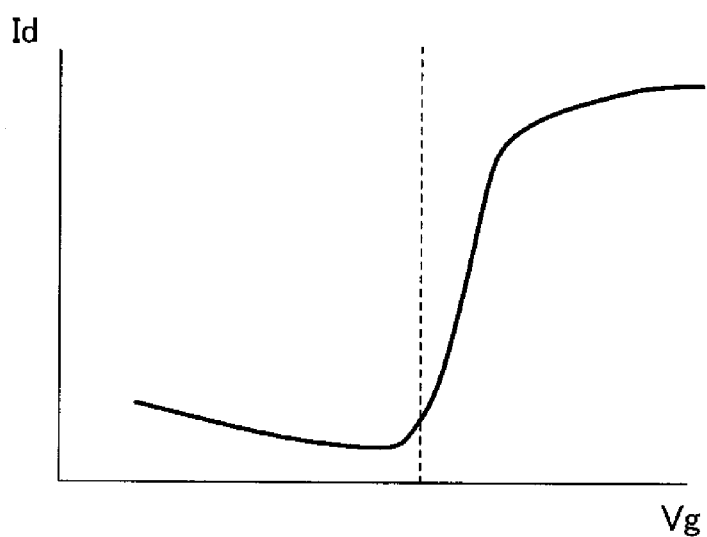
FIG. 7D is a graph showing the Vg-Id characteristic of the thin film transistor according to the embodiment of the present invention.

FIG. 7C shows the Vg-Id characteristic of the thin film transistor according to the embodiment of the present invention where the Vg-Id characteristic is divided into aback channel component and a front channel component, and FIG. 7D shows the Vg-Id characteristic of the thin film transistor as a whole. As shown in FIG. 7C, a drain current Id of the back channel component IDK rises at a gate voltage Vg higher than the drain current Id of the front channel component IFR. This is because that, a peak of the impurity concentration moves upwardly so that the impurity concentration in the back channel portion CLB is increased whereby a so-called threshold voltage Vth of the back channel portion CLB is increased. FIG. 7D shows a product obtained by synthesizing these components. In FIG. 7D, a solid line indicates the Vg-Id characteristic obtained by synthesizing the respective components. At a gate voltage Vg which is higher than the voltage at which the front channel component IFR rises, the back channel component IBK is considerably smaller than the front channel component IFR and hence, a hump is largely suppressed in the graph.

When the hump is suppressed, a threshold-value voltage Vth at the time of manufacture can be controlled by focusing solely on the front channel component. As a result, the threshold voltage Vth can be easily controlled thus suppressing the generation of irregularities in the threshold voltage Vth of a product. Accordingly, it is possible to obtain an advantageous effect that a yield in the manufacture of display devices can be enhanced.

Next, a method of manufacturing the array substrate according to the embodiment of the present invention is explained in conjunction with FIG. 8A to FIG. 8J. Here, the explanation is made with respect to a case where n-type thin film transistors made of poly-silicon and having the bottom-gate structure are formed over the array substrate.

Figure 8A:
FIG. 8A is a view for explaining one step in manufacturing an array substrate according to the embodiment of the present invention.

First of all, a contamination prevention film GN which prevents the thin film transistor from being contaminated by impurities from the array substrate SUB is stacked on the array substrate SUB. The array substrate SUB is formed of a transparent substrate such as a glass substrate, for example. The contamination prevention film GN is formed of a silicon nitride film using a CVD method, for example (FIG. 8A).

Figure 8B:
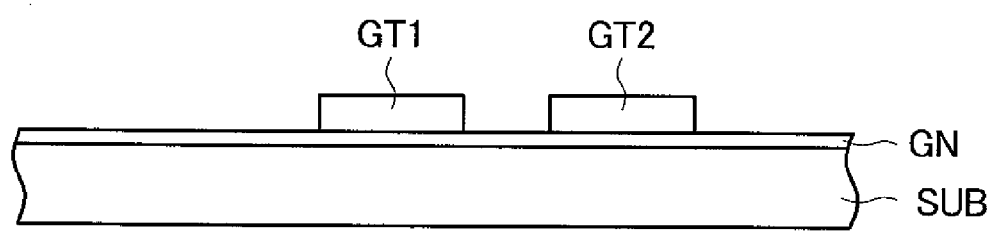
FIG. 8B is a view for explaining another step in manufacturing the array substrate according to the embodiment of the present invention.

Next, the gate electrode film is formed. The gate electrode film may preferably be made of a conductive material having a relatively high melting point such as Mo, W, Ti, Ta or an alloy of these metals because the gate electrode film is heated at a high temperature in a Si crystallization process which is performed in a later stage. The gate electrode film is formed into a predetermined shape by a known photolithography step and a known etching step (FIG. 8B). In FIG. 8B, gate electrodes GT1, GT2 are shown as portions of the gate electrode film.

Figure 8C:
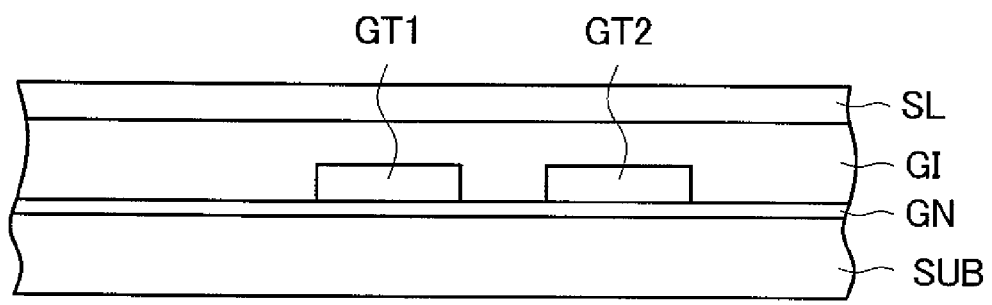
FIG. 8C is a view for explaining another step in manufacturing the array substrate according to the embodiment of the present invention.

The gate insulation film GI is formed so as to cover the gate electrode film, and the semiconductor film SL is formed on the gate insulation film GI. The gate insulation film GI is made of silicon dioxide ($SiO_2$), for example, and is formed by a CVD method or the like. The semiconductor film SL is formed such that an amorphous silicon film is firstly formed by a CVD method, and the dehydrogenization treatment or the like is applied to the amorphous silicon film and, thereafter, the amorphous silicon film is crystallized into a poly-silicon film by laser annealing such as excimer laser annealing (FIG. 8C).

Figure 8D:
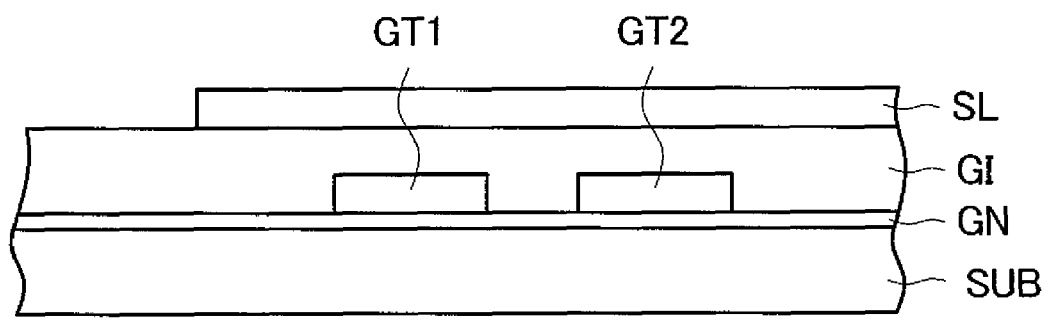
FIG. 8D is a view for explaining another step in manufacturing the array substrate according to the embodiment of the present invention.

The semiconductor film SL is formed into a shape shown in FIG. 2 or FIG. 3 by a known photolithography step and a known etching step (FIG. 8D).

Figure 8E:
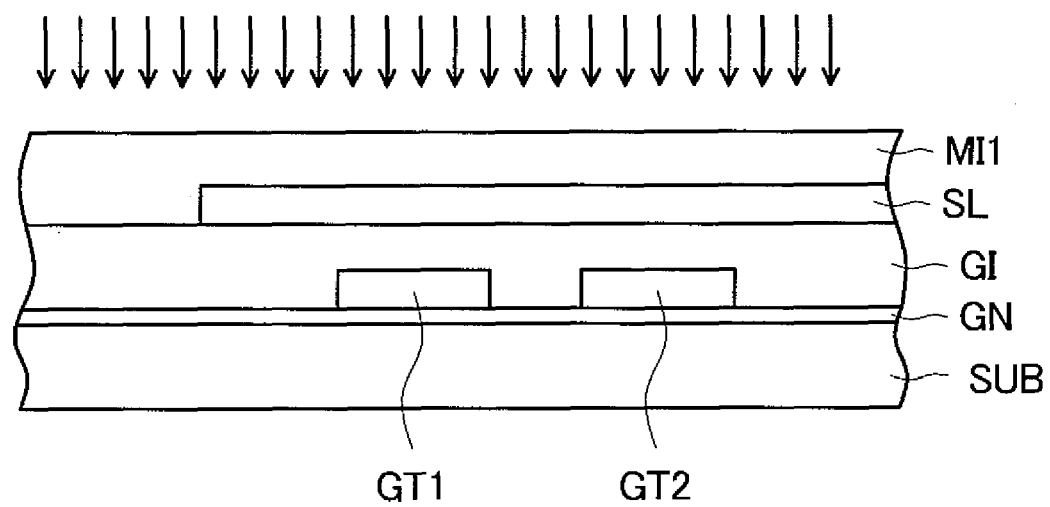
FIG. 8E is a view for explaining another step in manufacturing the array substrate according to the embodiment of the present invention.

Next, an insulation film MI1 is formed over the array substrate SUB in a state where the insulation film MI1 covers the semiconductor film SL. The insulation film MI1 is a silicon nitride film, for example, and is formed by a CVD method. Since impurities are implanted into the semiconductor film SL by way of the insulation film MI1, it is preferable to set a film thickness of the insulation film MI1 to 200 nm or less. Further, impurities are implanted into the semiconductor film SL for controlling electric characteristics of the thin film transistor (FIG. 8E). The impurities may be boron (B) or the like, for example.

In implanting such impurities into the semiconductor film SL, ions of the impurities which are accelerated by an electric field are implanted into the semiconductor film SL such that a peak of the impurity concentration distribution is positioned at an upper side from the center of the semiconductor film SL, for example, at a depth obtained by internally dividing a distance from an upper surface to a lower surface of the semiconductor film by a ratio of 1:3. This position of the peak of the impurity concentration distribution is adjusted by adjusting parameters such as an electric field applied to ions or a dose of ions. A plurality of arrows described on an upper part of FIG. 8E schematically express a state where the impurities are implanted into the semiconductor film SL.

Figure 8F:
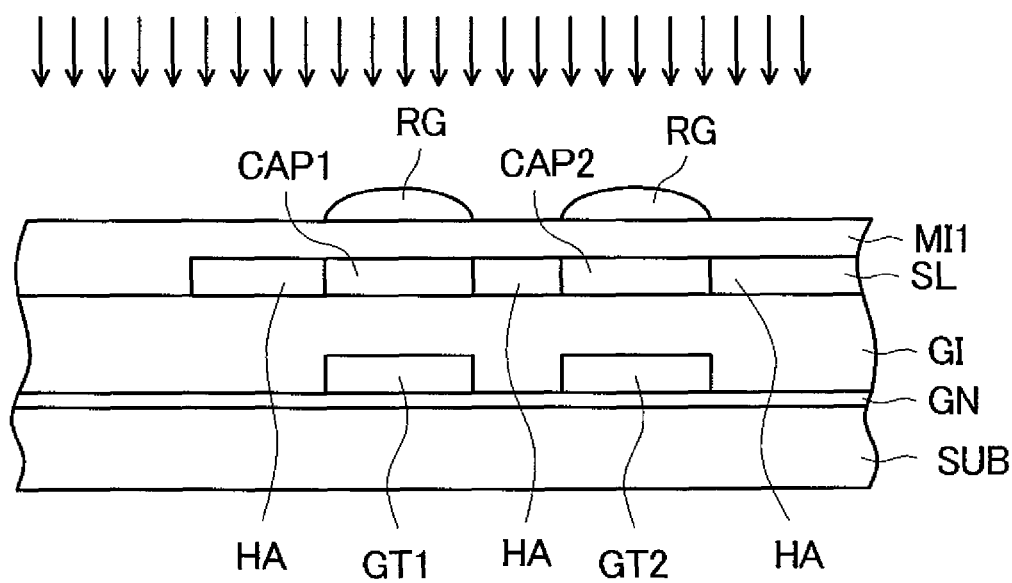
FIG. 8F is a view for explaining another step in manufacturing the array substrate according to the embodiment of the present invention.

A photo resist is applied to the insulation film MI1 by coating and, thereafter, the photo resist is patterned such that a photo resist RG remain on the insulation film MI1 at predetermined positions corresponding to the channel regions CA1, CA2 which face the gate electrodes GT1, GT2 in an opposed manner and in the vicinity of the channel regions CA1, CA2. Then, impurities of typically 1e19 (atom/$cm^3$) or more are implanted into the semiconductor film. SL so as to form first impurity regions HA (FIG. 8F). The impurities are, for example, phosphorous (P) or the like. A plurality of arrows described on an upper part of FIG. 8F schematically express, in the same manner as FIG. 8E, a state where the impurities are implanted into the semiconductor film SL.

Figure 8G:
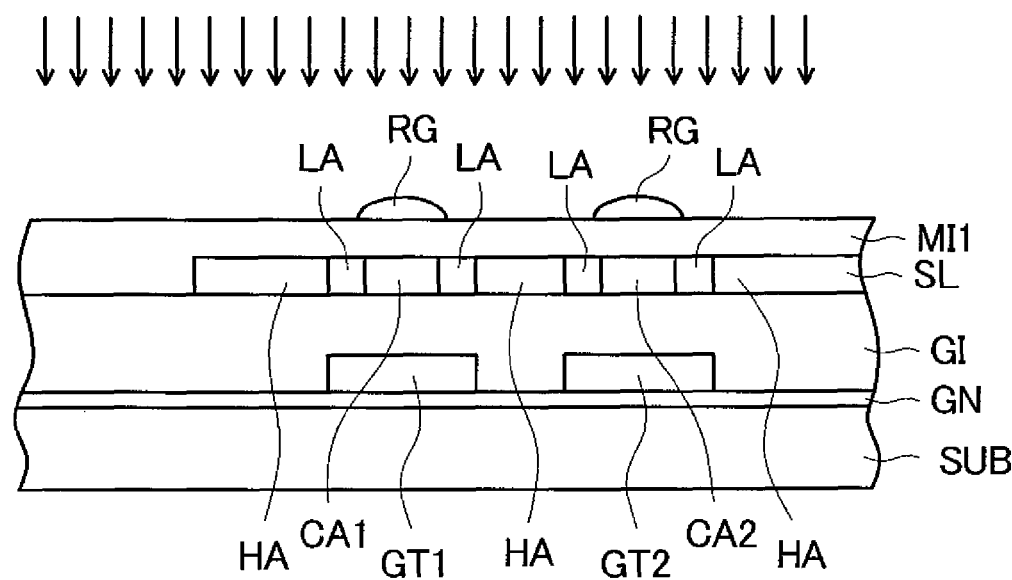
FIG. 8G is a view for explaining another step in manufacturing the array substrate according to the embodiment of the present invention.

The photo resists RG are retracted by a length of 0.5 to 2.0 μm typically by applying reflow processing such as ashing or heat treatment to the photo resist RG. Then, impurities of a dose which falls within a range from typically 1e17 to 1e19 (atom/$cm^3$) are implanted into the semiconductor film SL so as to form second impurity regions LA into which impurities of concentration lower than the impurity concentration of the first impurity regions HA are implanted (FIG. 8G). The impurities are phosphorous (P) or the like, for example. Generally speaking, the impurities of the second impurity regions LA are made of the same material as the impurities of the first impurity regions HA. However, the impurities of the second impurity regions LA may be made of a material different from a material for forming the impurities of the first impurity regions HA. After forming the second impurity regions LA, the photo resist RG is removed by ashing. A plurality of arrows described on an upper part of FIG. 8G express, in the same manner as FIG. 8E and FIG. 8F, a state where the impurities are implanted into the semiconductor film SL.

By adjusting a pattern shape of the above-mentioned photo resist RG, a retraction length of the photo resist by the above-mentioned reflow treatment or the like, it is possible to form the channel regions CA1, CA2, the second impurity regions LA which abut on the channel regions CA1, CA2, and the first impurity regions HA which abut on the second impurity regions LA from the outside in each TFT shown in FIG. 2 and FIG. 3.

Here, by performing the above-mentioned reflow treatment, it is possible to suppress irregularities in a length of a region of the second impurity region LA. Further, by adjusting the pattern shape of the above-mentioned photo resist RG, it is possible to increase or decrease a channel length of a channel region in each thin film transistor.

Figure 8H:
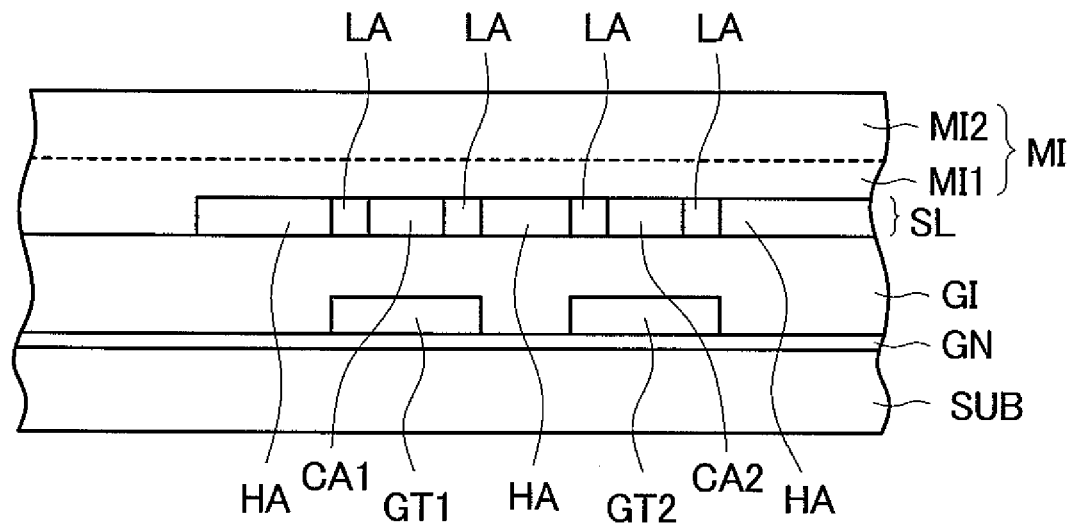
FIG. 8H is a view for explaining another step in manufacturing the array substrate according to the embodiment of the present invention.

An interlayer insulation film MI is formed by further stacking an insulation film MI2 on the insulation film MI1. The interlayer insulation film MI is provided for suppressing the capacitances generated between the gate electrode film, and the video signal line DL, the source electrode ST and the like. Thereafter, for activating impurities contained in the impurity regions HA, LA or for repairing crystal defects generated by the impurities implantation, annealing is performed (FIG. 8H).

Figure 8I:
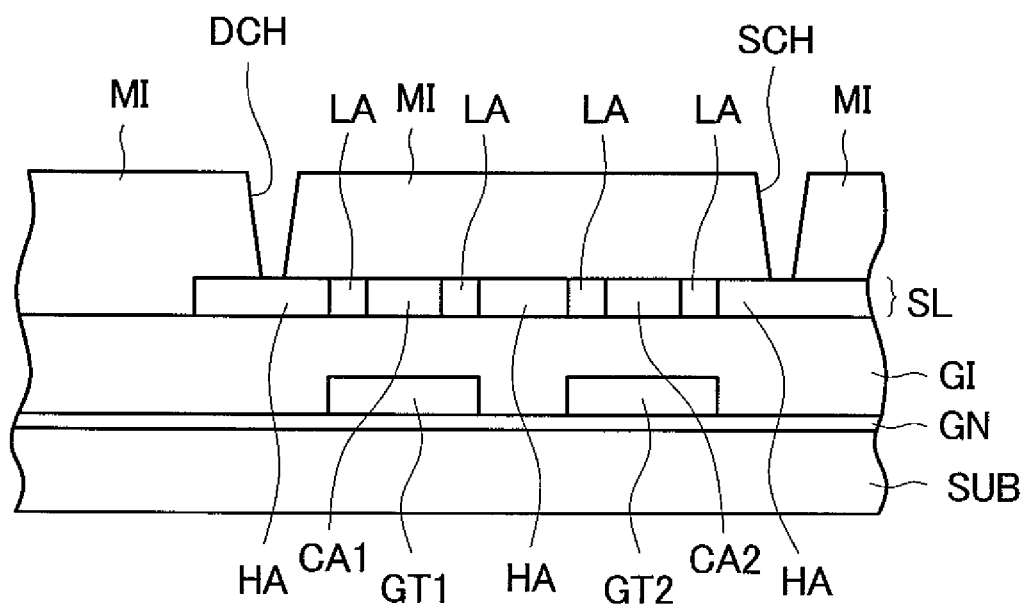
FIG. 8I is a view for explaining another step in manufacturing the array substrate according to the embodiment of the present invention.

Further, the contact holes DCH, SCH are formed by a known photolithography step and a known etching step (FIG. 8I).

Figure 8J:
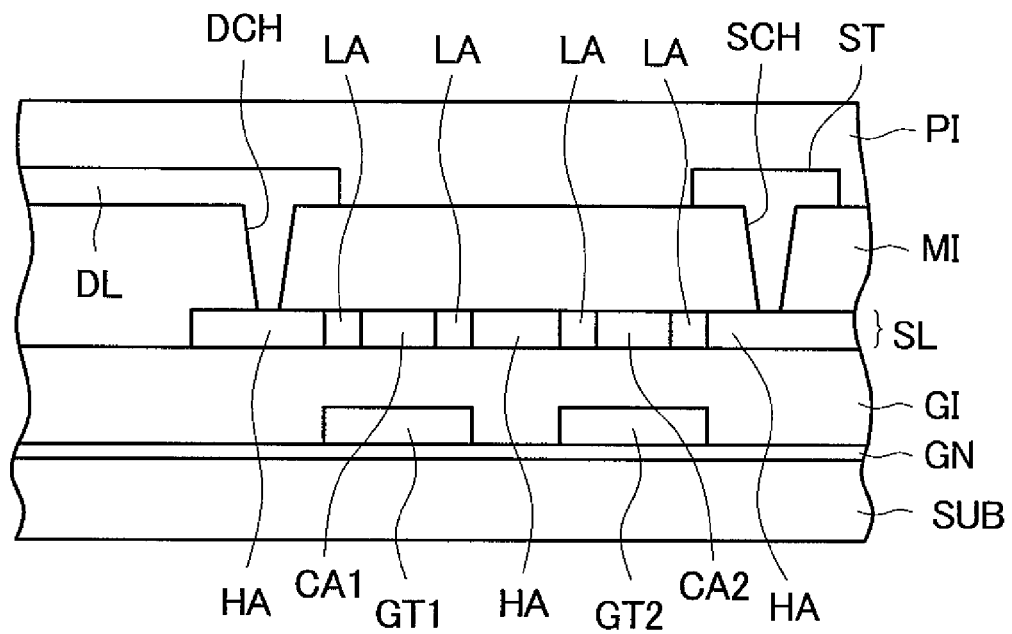
FIG. 8J is a view for explaining another step in manufacturing the array substrate according to the embodiment of the present invention.

The source electrode ST and the video signal line DL which are connected with the pixel electrode PX via the contact holes are formed. A passivation film PI is formed over the array substrate SUB such that the passivation film PI covers the source electrode ST, the video signal line DL and the interlayer insulation film MI. The passivation film PI is made of silicon nitride (SiN) and is formed by a CVD method, for example. Thereafter, annealing is performed for coupling hydrogen to a dangling bond applied to the semiconductor film SL, an interface between the semiconductor film SL and the gate insulation film GI or the like (FIG. 8J).

Thereafter, as shown in FIG. 3, a leveling film FL and the common electrode CT are formed. Next, an upper insulation protective film TI is formed, and a contact hole PCH is formed by a known photolithography step and a known etching step. Then, a pixel electrode PX is formed thus constituting an IPS type pixel region.

Figure 9:
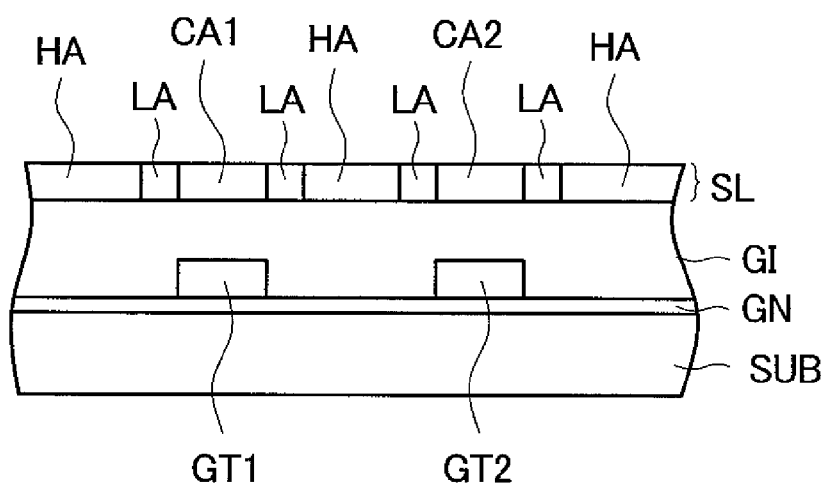
FIG. 9 is a cross-sectional view showing another example of the thin film transistor according to the embodiment of the present invention.

FIG. 9 is a cross-sectional view showing another example of the thin film transistor according to this embodiment. The structure shown in FIG. 9 differs from the structure shown in FIG. 4 with respect to a planar positional relationship between the gate electrodes GT1, GT2 and the first impurity regions HA and the channel regions CA1, CA2. This example is substantially equal to the example shown in FIG. 4 with respect to impurity concentration distribution of the semiconductor film SL in the channel regions CA1, CA2. The thin film transistor of this example is characterized in that the gate electrodes GT1, GT2 overlap with the channel regions CA1, CA2 respectively, but do not overlap with the second impurity regions LA. The structure in which the second impurity region LA, the channel region and the gate electrode satisfy the above-mentioned relationship is referred to as the LDD (Lightly Doped Drain) structure. This structure can also suppress a hump in the Vg-Id characteristic in a back channel portion. The manufacturing steps are substantially equal to the manufacturing steps of the example shown in FIG. 4. Particularly, at a stage shown in FIG. 8B, sizes of the gate electrodes GT1, GT2 may be set in conformity with the channel regions CA1, CA2.

Figure 10:
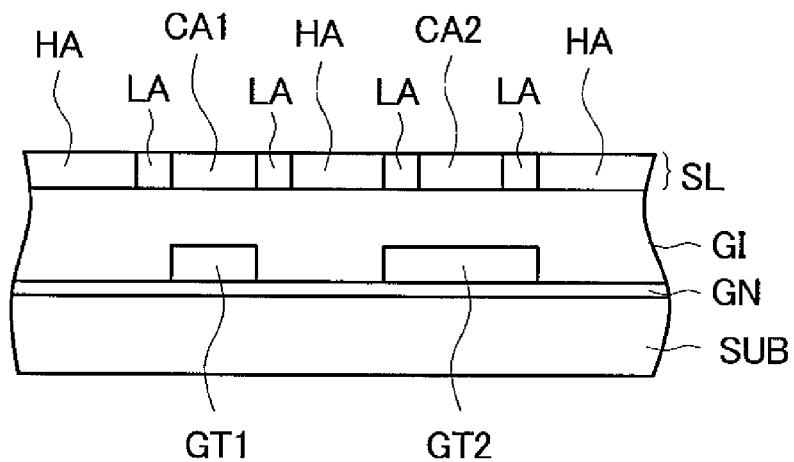
FIG. 10 is a cross-sectional view showing still another example of the thin film transistor according to the embodiment of the present invention.

FIG. 10 is a cross-sectional view showing still another example of the thin film transistor according to this embodiment. The structure shown in FIG. 10 differs from the structure shown in FIG. 4 with respect to a planar positional relationship between the gate electrodes GT1, GT2, the first impurity regions HA and the channel regions CA1, CA2. This example is substantially equal to the example shown in FIG. 4 with respect to impurity concentration distribution of the semiconductor film SL in the channel regions CA1, CA2. The thin film transistor of this example adopts the structure which is the combination of the previously-mentioned LDD structure and GOLD structure. That is, the gate electrode GT1 and the channel region CA1 overlap with each other, but the gate electrode GT1 does not overlap with the second impurity regions LA. On the other hand, the gate electrode GT2 overlaps with the channel region CA1 and the second impurity regions LA. This structure can also suppress a hump in the Vg-Id characteristic in a back channel portion. The manufacturing steps are substantially equal to the manufacturing steps of the example shown in FIG. 4. Particularly, at a stage shown in FIG. 8B, a size of the gate electrode GT1 may be set in conformity with the channel regions CA1.

Here, in the above-mentioned embodiment, the explanation has been made with respect to the case where the thin film transistor is the n-type thin film transistor in which the carries are electrons due to impurities. However, the present invention is also applicable to a p-type thin film transistor in which the carriers are holes.

Figure 11:
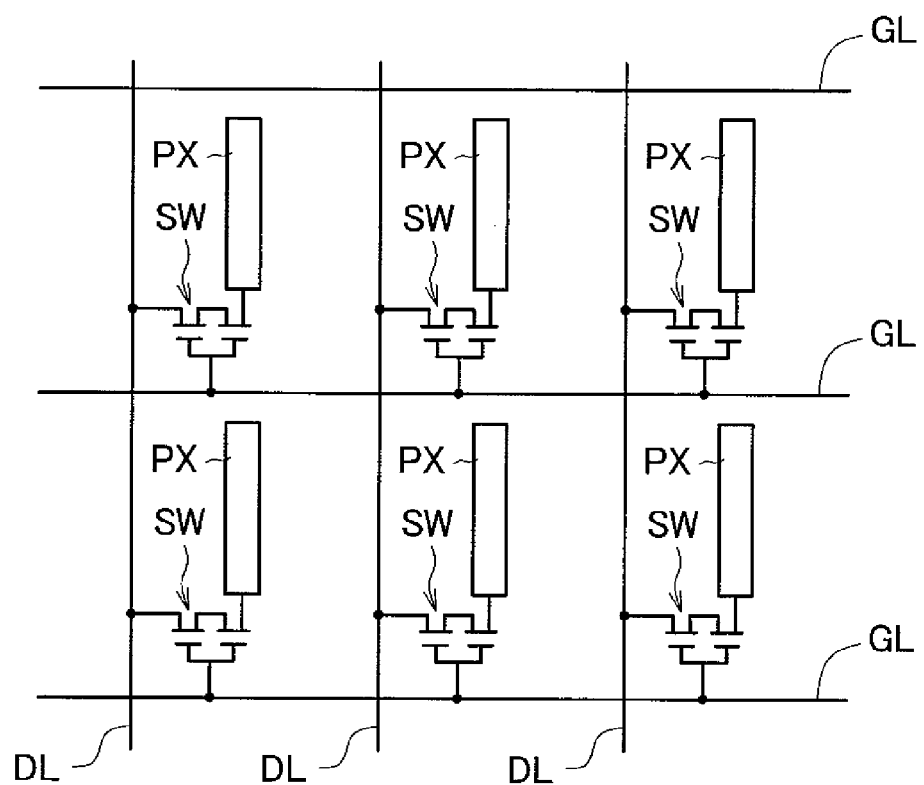
FIG. 11 is a view showing one example of an equivalent circuit of an array substrate which constitutes a VA-type or a TN-type liquid crystal display device.

Although the IPS-type liquid crystal display device has been explained as the display device according to the embodiment of the present invention, the present invention is also applicable to a VA (Vertically Aligned)-type liquid crystal display device, a TN(Twisted Nematic)-type liquid crystal display device or a display device which uses an element such as an organic EL (Electro Luminescence). FIG. 11 is a view showing an equivalent circuit of an array substrate which constitutes a VA-type or a TN-type liquid crystal display device. In the VA-type liquid crystal display device or the TN-type liquid crystal display device, although a common electrode CT is formed on a filter substrate which faces an array substrate in an opposed manner, the display device includes pixel switches SW in the same manner as the IPS-type liquid crystal display device, and the above-mentioned thin film transistor can be used as the pixel switch SW.

What is claimed is:

1. A display device comprising:
   a conductive layer on which gate electrodes are formed;
   a first insulation layer which is formed on the conductive layer;
   a semiconductor layer which is formed on the first insulation layer and is provided for forming semiconductor films which contain poly-crystalline silicon above the gate electrodes; and
   a second insulation layer which is formed on the semiconductor layer, wherein
   the semiconductor film includes a channel region which overlaps with the gate electrode as viewed in a plan view, and
   in the channel region, a portion of the semiconductor film which is in contact with the second insulation layer exhibits higher impurity concentration than a portion of the semiconductor film which is in contact with the first insulation layer.

2. A display device according to claim 1, wherein the semiconductor film in the channel region has a peak where the impurity concentration becomes maximum at an upper side from the center of the semiconductor film in the film thickness direction.

3. A display device according to claim 2, wherein the semiconductor film in the channel region has the distribution of impurity concentration where the impurity concentration is monotonously decreased toward an upper surface of the semiconductor film from a position where the semiconductor film exhibits the peak in impurity concentration, and the impurity concentration is monotonously decreased toward a lower surface of the semiconductor film from the peak in impurity concentration.

4. A display device according to claim 2, wherein the semiconductor film is doped with ions of the impurities which are accelerated by an electric field such that the peak in the distribution of the impurities is positioned at an upper side from the center of the semiconductor film in the channel region.

5. A display device according to claim 4, wherein the impurities are boron.

6. A manufacturing method of a display device comprising the steps of:
   forming a conductive layer in which gate electrodes are formed on an insulation substrate;
   forming a first insulation layer on the conductive layer;
   forming a semiconductor layer which contains poly-crystalline silicon and in which semiconductor films which overlap with the gate electrodes as viewed in a plan view are formed on the first insulation layer;

forming a second insulation layer on the semiconductor layer; and doping the semiconductor films with the impurities such that the concentration of impurities in a portion of the semiconductor film which is in contact with the second insulation layer is set higher than the concentration of impurities in a portion of the semiconductor film which is in contact with the first insulation layer.

7. A manufacturing method of a display device according to claim 6, wherein the step of doping the semiconductor films with the impurities is a step where ions of the impurities which are accelerated by an electric field are implanted into the semiconductor film such that a peak of the distribution of the impurity concentration in the film thickness direction is positioned at an upper side from the center of the semiconductor film.

8. A manufacturing method of a display device according to claim 7, wherein the impurities are boron.

* * * * *